Figure 1:
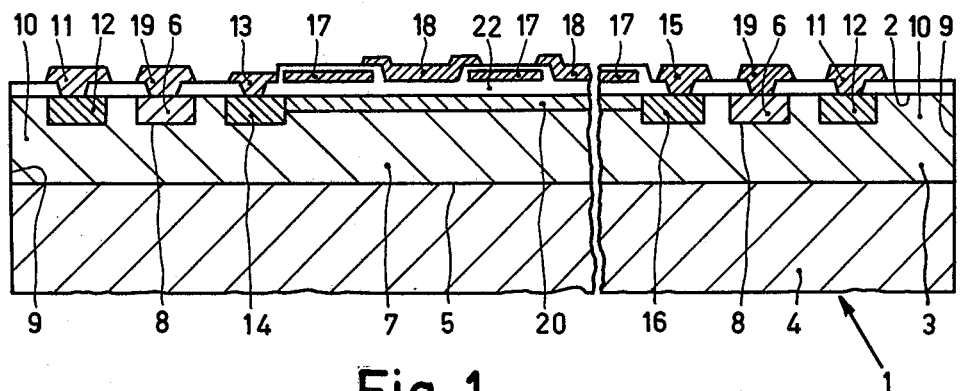

United States Patent [19]

Esser

[11] 3,965,481
[45] June 22, 1976

[54] CHARGE TRANSFER DEVICE WITH J FET ISOLATION AND MEANS TO DRAIN STRAY CHARGE

[75] Inventor: Leonard Jan Maria Esser, Eindhoven, Netherlands

[73] Assignee: U.S. Philips Corporation, New York, N.Y.

[22] Filed: Nov. 22, 1974

[21] Appl. No.: 526,174

[52] U.S. Cl. .............................. 357/24; 307/221 D; 357/15; 357/22; 357/48; 357/50
[51] Int. Cl.² .................. H01L 27/04; H01L 29/64; H01L 29/80
[58] Field of Search .................. 357/15, 22, 24, 48, 357/49, 50; 307/221 D, 304

[56] References Cited
UNITED STATES PATENTS

| | | | |
|---|---|---|---|
| 3,035,186 | 5/1962 | Doucette | 357/22 |
| 3,653,988 | 4/1972 | Glinski et al. | 357/22 |
| 3,739,240 | 6/1973 | Krambeck | 357/24 |
| 3,790,825 | 2/1974 | Barron et al. | 357/22 |
| 3,792,322 | 2/1974 | Boyle et al. | 357/24 |

FOREIGN PATENTS OR APPLICATIONS 1,208,266  10/1970  United Kingdom ................... 357/15

OTHER PUBLICATIONS

DeFalco, "...Denser Bipolar Devices," *Electronics,* July 19, 1971, p. 78.

*Primary Examiner*—William D. Larkins
*Attorney, Agent, or Firm*—Frank R. Trifari; Leon Nigohosian

[57] ABSTRACT

A semiconductor device comprising a surface layer of one conductivity type provided on a support and separated therefrom by a junction, said surface layer defining a surface and comprising island-insulating means in the form of an electrode pattern at the surface and which surrounds at least an island-shaped part of the surface layer comprising a component. The electrode pattern is separated from the surface layer by a barrier junction and is to induce electric fields in the surface layer to form a depletion region that is below the electrode pattern and extends throughout the thickness of the surface layer, an electric connection for draining leakage currents, is at part of the surface layer present at the edge of the surface and outside the pattern.

10 Claims, 5 Drawing Figures

CHARGE TRANSFER DEVICE WITH J FET ISOLATION AND MEANS TO DRAIN STRAY CHARGE

The invention relates to a semiconductor device having a semiconductor body and comprising a surface layer of one conductivity type which adjoins a surface of the body, is provided on a support and is separated from said support by a junction destined for electric insulation, in which at least one component is present in the surface layer in behalf of which the surface layer comprises island-insulating means in the form of an electrode pattern which is present at the surface and which, viewed on the surface, surrounds at least an island-shaped part of the surface layer comprising the component and which is separated from the surface layer by a barrier junction in which by means of the electrode pattern electric fields can be induced in the surface layer by means of which fields a depletion region is formed below the electrode pattern and extends throughout the thickness of the surface layer.

The device may form, for example, an integrated circuit having two or more circuit elements, for example, transistors, resistors, diodes, and so on which should be insulated from each other and are therefor provided in various islands. The device may also comprise a single island, for example, in the case of charge-coupled device with bulk transport in which the information channel along which the information formed by charge packets is transported is defined by the island insulation.

The surface layer may be formed, for example, by a n-type epitaxial silicon layer which is provided on a support or substrate of a p-type silicon and is separated herefrom by a p-n junction to be biased in the reverse direction as is usual in most integrated circuits. The island insulation in such a semiconductor body may be formed by a shallow p-type surface zone (or zones) which is provided via the surface, extends from the surface over a part of the thickness of the epitaxial layer into the epitaxial layer, and forms a reverse p-n junction with the n-type epitaxial layer. By applying a voltage in the reverse direction across said p-n junction the region of the epitaxial layer present below said zone can be depleted so that an insulated island can be obtained the bottom of which adjoins the p-type substrate and the upright walls at the formed depletion region. Instead of such a shallow p-type surface zone, metal layers which are separated from the body by a Schottky junction or by an insulating layer of, for example oxide, may be used for the island insulation.

Island insulation of the above-described type differs from the most conventional island insulation which is formed by a p-type zone which extends from the surface throughout the thickness of the epitaxial surface layer down the substrate. The use of such a deep p-type zone presents the advantage inter alia that such a zone can be provided along the whole edge of the body so that the p-n junction between the substrate and the epitaxial layer terminates below the surface which can be passivated by a silicon oxide layer.

One of the advantages of island insulation in the form of a shallow p-type surface zone is that the choice possibility as regards the voltages to be applied is considerably extended. In some cases, inter alia in charge-coupled devices, this may be advantageous in particular because it is often desired in these cases to apply to the surface zone forming the island insulation a voltage or potential differing from that at the substrate.

A further advantage resides in the fact that the provision of a shallow zone or Schotty-metal layer is considerably simpler than the provision of a deep insulation extending throughout the thickness of the epitaxial layer.

However, the use of island-insulating means of the type to which the invention relates also involves a number of drawbacks. For example, when a shallow surface zone of the conductivity type opposite to that of the surface layer and extending not throughout the thickness of the epitaxial surface layer is used, in the case in which said zone extends at least partly along the edge of the body, the p-n junction between the zone and the surface layer may locally terminate at the edge instead of below the surface and may therefore in many cases not be passivated for example by a silicon oxide layer. Moreover, the p-n junction in this case may be damaged during the manufacture of the device in that a large number of devices is usually provided simultaneously in the starting body after which the starting body is broken or scratched into separate parts along the edges of the individual devices.

It has been found that when said zone is provided entirely at a distance from the edge of the body, the island insulation and hence the device operates less readily than could be expected and/or is desired on the basis of the electric operation of the whole device.

Similar problems may also occur in the case in which the island insulation is formed by a metal layer which is provided on the surface and which forms a rectifying Schottky junction with the surface layer.

In particular in the case of charge-coupled devices with bulk transport the non-operation or only moderate operation of the island insulation can influence the operation of the device very detrimentally. Such a device comprises a series of charge storage regions which are present in an island, are separated from each other in the island by potential hills generated with electrodes and furthermore on the side by the island insulation. Charge packets which each represent information may be present in the charge storage regions. In the case of a poorly operating island insulation, leakage currents may flow from the part of the surface layer present outside the island insulation into the island and be added to the charge packets which are present in the charge storage regions. In particular at low frequencies the operation of the device is thus restricted seriously.

It is one of the objects of the invention to provide a semiconductor device of the kind described in the preamble in which the said drawbacks are avoided at least for the greater part.

The invention is based inter alia on the recognition that when the island insulation is provided at a finite distance from the edge of the semiconductor body the potential of the part of the surface layer present between the insulation and the edge is not constant during operation but can vary more or less gradually as a result of inter alia thermal generation of charge carriers and that in such manner that after a certain period of time the potential difference between the island insulation and the said part of the surface layer has decreased to below a minimum value at which the island insulation still operates properly.

A semiconductor device of the above-described type is therefore characterized according to the invention in that a part of the surface layer which is present outside the pattern and which adjoins the part of the surface layer which can be influenced with the pattern and in which the depletion region can be formed, has an electric connection for draining leakage currents.

By means of said extra connection — which in most constructions consists simply of a conductive contact-generated charge carriers of one conductivity type (so electrons in the case in which the surface layer is formed by n-type layer) can be dissipated. At the same time the generated charge carriers of the opposite type (holes) can be drained, either via, for example, the island insulation, or via the substrate. Since consequently in a device according to the invention both the generated holes and the generated electrons can both be drained, the potential of the part of the surface layer present between the island insulation and the edge can be maintained during operation at a constant, suitably chosen level, preferably above the pinch-off voltage of the part below the electrode pattern. As a result of this, problems which are caused by the non-operation or at least poor operation of the island insulation can be avoided. The pattern may be present entirely at a distance from the edge of the surface and be separated from said edge by the said part of the surface layer which is present outside the pattern and surrounds the pattern entirely.

As already noted, the electrode pattern forming the island insulation may consist of a metal layer which is provided directly on the surface and forms a rectifying Schottky junction with the surface layer. The electrode pattern may also consist of a conductive layer of a metal or a suitable semiconductor material, for example polycrystalline silicon, which is insulated from the surface by an intermediately located insulating layer, for example of silicon oxide, in which the depletion region in the surface layer can be induced in a field effect-like manner.

A preferred embodiment is characterized in that the electrode pattern is formed by a surface zone which is of the second conductivity type opposite to the one conductivity type and is provided in the surface layer, said surface zone extending from the surface into the surface layer only over a part of the thickness of the surface layer.

The support may be formed by a layer of insulating material, for example of sapphire, on which the surface layer is deposited epitaxially or by a layer of metal which is separated from the surface layer by a rectifying junction. In most of the cases, however, the support will comprise a semiconductor layer or substrate of the second conductivity type forming a p-n junction with the surface layer of the one conductivity type. In this case, for passivating the p-n junction between the surface layer and the substrate, the surface layer may advantageously comprise along the whole edge of the body a further insulation region which extends from the surface throughout the thickness of the surface layer down to the substrate and preferably consists entirely of a zone of the second conductivity type.

The device may comprise an integrated circuit in which the island insulation encloses and mutually insulates a number of islands in which a number of circuit elements, for example transistors, are provided which should be insulated from each other. The device may also comprise a single island, for example in charge transfer devices in which the island-shaped part of the surface layer forms the charge transport layer of the charge transfer device, means are present to locally introduce information in the form of electric charge into the island-shaped part, and means present to read out said charge elsewhere in the island, and in which an electrode system is present at the surface to generate electric fields by means of which the charge can be transported to the read-out means through the island.

Figure 2:
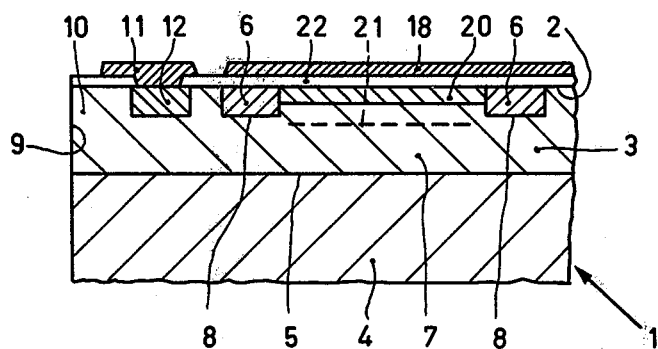
Figure 3:
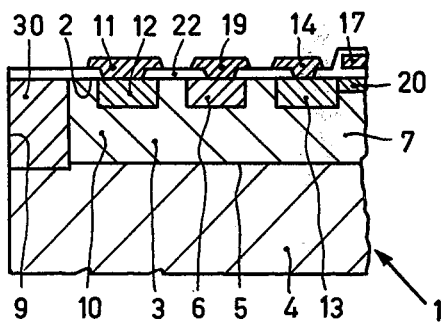
Figure 5:
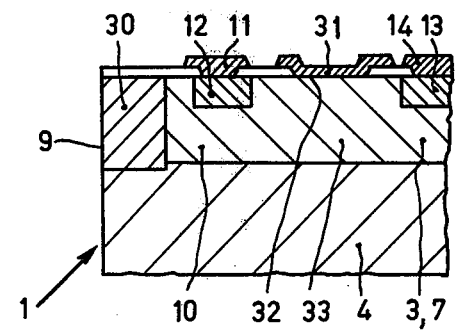
Figure 4:
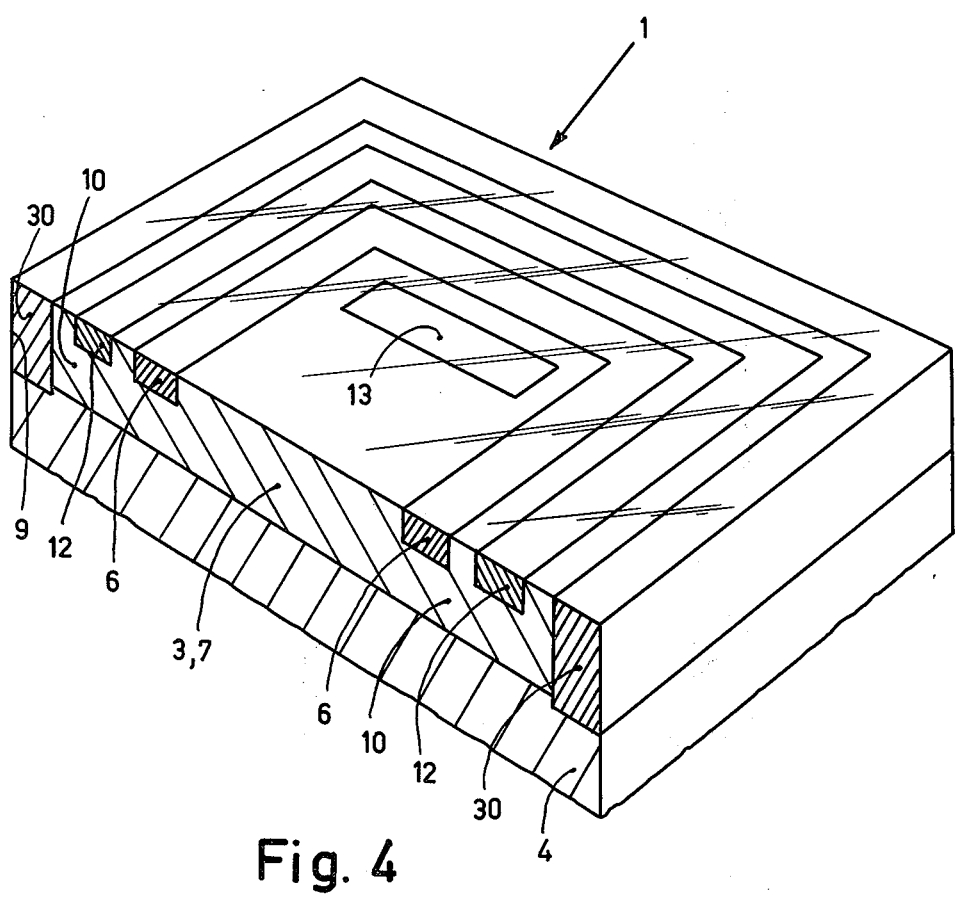

The invention will now be described in greater detail with reference to a few embodiments and the accompanying diagrammatic drawing, in which:

FIG. 1 is a cross-sectional view of a first embodiment of a device according to the invention, FIG. 2 is a second cross-sectional view of the device shown in FIG. 1, FIG. 3 is a cross-sectional view of a part of a second device according to the invention, FIG. 4 is a perspective view of a part of the device shown in FIG. 3, FIG. 5 is a cross-sectional view of a part of a third device according to the invention.

It is to be noted that the Figures are only diagrammatic and are not drawn to scale in particular for reasons of clarity.

FIGS. 1 and 2 are cross-sectional views of a first embodiment of a semiconductor device according to the invention. The device comprises a semiconductor body 1 having a surface layer 3 which adjoins the surface 2. Said surface layer is in the form of an epitaxial n-type silicon layer deposited on a support 4. Of course, other suitable semiconductor materials may also be used instead of silicon. In the present embodiment the support 4 is formed by a semiconductor substrate of p-type silicon which is separated from the epitaxial surface layer 3 by the p-n junction 5 destined for electric insulation. Instead of silicon, the support 4 may also consist of other materials, for example, of insulating materials such as sapphire. The support may furthermore be formed by a substrate body having a p-type component layer 4 which adjoins the epitaxial layer 3 and a further component layer which is present below the component layer 4, consists of n-type silicon and is separated from the epitaxial layer 3 by the intermediate component layer 4.

Present in the surface layer 3 is an electric component formed by a charge transfer device in behalf of which the layer 3 has island-insulating means 6. Said island insulation in the form of an electrode pattern present at the surface 2 surrounds at least an island-shaped part 7 of the surface layer 3 which forms part of the charge transfer device.

The island insulation 7 is formed by a p-type surface zone which is provided in the epitaxial layer 3, extends from the surface 2 only over a part of the thickness of the layer 3 and is separated from the n-type layer by a p-n junction 8. The term "electrode pattern" for the island insulation 6 should be considered in that sense that by means of the insulation zone 6 electric fields can be induced in the epitaxial surface layer 3 by means of which field a depletion region is formed below the electrode pattern (or island insulation) 6 which extends throughout the thickness of the layer 3 and therefore further forms and/or completes the island insulation. So at its upright walls the island 7 is bounded by the island zone 6 in combination with a depletion region below the insulation zone 6 which is obtained by biasing the p-n junction 8 in the reverse direction. Instead of by the p-type zone 6 the electrode pattern may therefore also be formed by a metal layer which is separated from the layer 3 by a reverse Schottky junction or by an insulating layer.

It is to be noted that during operation the p-n junction 5 between the substrate 4 and the epitaxial layer 3 is usually also biased in the reverse direction so that a depletion region also extends from the p-n junction 5 in the epitaxial layer and can form the lower boundary of the island.

According to the invention, the part 10 of the epitaxial surface layer which is present at the edge 9 of the surface or the body and outside the pattern 6 which part adjoins the part of the epitaxial surface layer 3 in which the depletion region can be formed which can be influenced with the pattern (zone) 6 comprises an electric connection for draining leakage currents.

The pattern or zone 6 is preferably situated entirely at a distance from the edge 9 and is separated from the edge 9 by the part 10 which is present outside the pattern and surrounds the pattern 6 entirely.

In the embodiment described, the island-shaped part 7 of the epitaxial layer 3 constitutes the charge transport layer of a charge transfer device or CTD. Information in the form of charge packets can be introduced into the layer or the island-shaped part 7 via the input contact 13, 14 comprising the metal (aluminium) contact 13 and the n+ contact zone 14. Such charge packets can of course also be introduced differently, for example, by absorption of radiation incident in the layer 7. The introduced charge can be read elsewhere in the island-shaped part 7 by means of read-out means of which FIG. 1 shows only the output contact 15, 16 comprising the metal contact 15 and the n+ contact zone 16. For generating electric fields by means of which the charge can be transported through the island 7 from the input 13, 14 to the output or read-out means 15, 16 in a direction parallel to the surface layer 3, an electrode system comprising the electrodes 17, 18 is present at the surface 2. The electrodes 17, 18 form a double-layer metallization pattern in which the electrodes denoted by 17 and belonging to the lower metallization layer consist, for example, of doped polycrystalline silicon and the electrodes denoted by 18 and belonging to the upper metallization layer are of aluminium and can be provided simultaneously with the contacts 11, 13, 15 and with the contact 19 of the island insulation 6. As is known, one of the advantages of such an electrode system in the form of a multi-layer metallization is that the mutual distance between two successive electrodes can be made very small so that the occurrence of potential pits or potential hills between successive charge storage regions in the island 7 can be prevented.

The charge transfer device belongs to the type of charge-coupled devices in which the charge transport in the form of electrons supplied via the input contact 13, 14 can take place at least mainly via the interior of the semiconductor layer 3. For that purpose, the island 7 has a thickness and a doping concentration which are so small that a depletion region can be obtained throughout the thickness of the island by means of an electric field while avoiding breakdown.

As is shown in FIGS. 1 and 2, a thin n-type surface layer 20 which has the same conductivity type as and a higher doping than the epitaxial layer 3 is present in the island. The presence of said surface layer has the advantage that the charge handling capability of the device is increased as is described inter alia in Ser. No. 450,996, filed Mar. 14, 1975.

For the explanation of the mode of operation of the device according to the present embodiment, reference is also made to said prior application. In order to elucidate the operation of the device, the cross-sectional view of FIG. 2 shows a charge packet 21 comprising a quantity of electrons which are denoted by-signs. Said charge packet is separated from further charge packets present in the island by potential barriers which can be generated in the island by means of the electrodes 17, 18. On the sides of the island 7 (charge transport layer) the charge packets are separated both from each other and from the parts 10 adjoining the edge 9 by means of electric fields which are formed in the epitaxial layer 3 below the p-type zone 6 by applying across the p-n junction 8 a sufficiently large voltage in the reverse direction via the contact 19. The voltage or potential which should be applied to the zone 6 in behalf of this, may advantageously be chosen to be different from the voltage or potential to be applied to the substrate 4 in that the zone 6 does not extend down to the substrate 4. In general it will be desired to choose the potential of the zone 6 to be so low that inversion of the conductivity type in the island 7 at the surface 2 below the electrodes 17, 18 is prevented and to apply a slightly higher potential to the substrate 4 in connection with the transport velocity during the transportation of charge packets 21 from a storage space to a subsequent storage space below a subsequent electrode. Since the whole insulation zone 6 is present at a distance from the edge 9 of the body 1, the p-n junction 8 between the p-type zone 6 and the n-type epitaxial layer 3 adjoins the surface 2 only and is hence protected by the passivating oxide layer 22 which is present at the surface 2. A part 10 of the epitaxial layer 3 in which preferably no further circuit elements are provided, remains present between the edge 9 and the insulation zone 6. In the absence of the electric connection 11, 12, the electric insulation often operates less readily than is desired and/or than might be expected. A possible explanation for this is that as a result of thermal generation of charge carriers or by generation as a result of absorption of incident radiation, the potential in the regions 10 varies more or less gradually and that in that sense that, since a number of the generated holes can be drained via the p-type substrate 4 and/or the p-type insulation zone 6, the potential in the regions 10 will fall. The voltage in the reverse direction applied across the p-n junction 8 may decrease to such an extent that conductivity of electrons becomes possible below the zone 6, which may result in increased leakage currents and hence in a deterioration of the properties of the CTD device, in particular at low frequencies. According to the present invention, by providing the device with the extra contact 11, 12 it is possible to drain generated electrons via said contact and hence to maintain the potential in the region at a constant value which is high enough relative to the potential of the insulation zone 6 to ensure a good island insulation, for example, at at least a potential at which pinch-off occurs below the p-type zone so that the region 10 is effectively insulated from the island 7.

It is to noted that the leakage currents which are generated in the island 7 itself can generally be drained via one or more of the connections of the circuit elements or the circuit elements in the island and as a result of this need generally not adversely influence the electric operation of the island insulation.

In a specific embodiment the substrate 4 has a thickness and a doping concentration of approximately 250 $\mu m$ and $10^{14}$–$10^{17}$ atoms/ccm, respectively. The epitaxial layer 3 has a thickness of approximately 5 $\mu m$ and a doping concentration of approximately $5\times10^{14}$ atoms/ccm, while the more highly doped surface region has a thickness of approximately 0.3 $\mu m$ and a doping concentration of approximately $5\times10^{16}$ atoms/ccm. Via the output contact 15, 16, a voltage of, for example, approximately 20 Volts is applied to the island 7, the potential of the substrate 4 being considered as a reference potential. By applying clock voltages between 0 to 10 Volts or between −5 and +5 Volts to the electrodes 17, 18, and when no charge carriers are supplied via the input contact, all electrons can be dissipated from the charge transport layer which is formed by the island, in which, for electrons, a potential minimum is formed at a finite distance from the surface 2 of the body. Applied simultaneously to the p-type insulation zone is a voltage suitably chosen with the depth of the p-zone, for example, −2 volt at a depth of 2 $\mu m$ of the zone, so that a depletion region and an electric field are formed below the insulation zone which form a part of the island insulation and which insulate the island 3 from the region 10. Via the contact 11, 12 the potential of the region 10 can be kept constant at a level which is at least equal to and preferably above the pinch-off voltage below the zone 6, for example at +5 volts.

The device can be manufactured in a manner generally known in semiconductor technology so that this need not be further explained.

FIG. 3 shows a part present on the left-hand edge in a cross-sectional view corresponding to that shown in FIG. 1 of a second embodiment of a semiconductor device according to the invention. The device for which corresponding components are referred to by the same reference numerals as for the device shown in FIGS. 1 and 2, differs from the device according to the first embodiment in that along the whole edge 9 of the surface 2 of the body 1 the epitaxial surface layer 3 has an insulation region 30 which extends from the surface 2 of the semiconductor body throughout the thickness of the surface layer 3 down to the substrate 4. The p-n junction 5 between the epitaxial layer 3 and the substrate 4 thus no longer terminates at the side edge 9 of the body 1 and is in this manner better protected against damage, for example, during breaking or scratching of the starting body in which a large number of elements are simultaneously manufactured and are subsequently subdivided into separate parts. The zone 30 may consist entirely or partly of insulating material, for example silicon oxide, which is sunk in the body 1 over at least a part of its thickness. In the present embodiment, however, the insulation region is formed by a p-type zone which extends from the surface 2 down to in the substrate 4. Said zone 30 can be manufactured in a manner known per se in semiconductor technology.

The p-type insulation zone 6 is provided at a distance from said deep p-type zone in particular so as to be able to apply to the insulation zone a lower potential or voltage than to the substrate 4 and the p-type zone 30 which is conductively connected to the substrate. The region 10 present between the zone 30 and the insulation zone 6 — in which region, like in the preceding embodiment, preferably no further components or circuit elements are present — again comprises an electric connection 11, 12 via which leakage currents can be drained so that a good island insulation can be obtained.

FIG. 4 is a perspective view of a part of the semiconductor device on the input side of the charge-coupled device; the oxide layer 22 present at the surface 2, the electrodes 17, 18 and the aluminum contacts 11, 13, 15, 19 are not shown for reasons of clarity. The p-type insulation zone 6 insulating the island 7 is present at a distance from the edge 9. The region 10 which is present outside the insulation zone 6 and which adjoins the part of the epitaxial layer 3 which is present below the zone and in which a depletion region with an associated electric field can be formed to insulate the island 7, is provided with the connection comprising the highly doped n-type contact zone 12. Said zone which in principle need be present only at the area of the contact extends in the present embodiment parallel to and concentric with the insulation zone 6 in the epitaxial layer 3 so that the electric resistance between the connection 11, 12 and whole region 10 can have a comparatively low value.

FIG. 5 is a cross-sectional view of a part of a further embodiment of a device according to the invention corresponding to the cross-sectional view shown in FIG. 3. As regards corresponding components, the device again bears the same reference numerals as the embodiments shown in FIG. 3 and/or 1. In the present embodiment, however, the island-insulating electrode pattern is not formed by a shallow p-type zone extending only over a part of the epitaxial layer, as in the preceding examples, but by a metal layer 31 which forms a rectifying Schottky junction 32 with the epitaxial layer 3. By again biasing the junction 32 in the reverse direction a depletion region can be formed in the region 33 of the epitaxial layer 3, which depletion region extends throughout the thickness of the layer 3 and forms an electric barrier for charge carriers on either side of the island insulation. The region 10 of the epitaxial layer 3 which adjoins the region 33 has an electric connection 11, 12 via which leakage currents can be drained during operation so that the potential in the region 10 can be maintained at a constant suitably chosen level. The leakage currents which are generated within the island 7 can in general be drained again via one of the zones or regions or connections of the component in the island. In the case in which the island, as described with reference to the first embodiment, comprises a charge-coupled device of the type described, the leakage currents (electrons) can be drained from the island via the input contacts 13, 14 and/or via the output contact which is not shown in FIG. 5.

For the manufacture of the Schottky junction 31, 32, any metal may be used which forms a rectifying junction with the semiconductor material, in the present case silicon, of the semiconductor layer 3. For example, when the doping concentration in the surface layer is sufficiently low, the metal may be aluminum. Other suitable metals are, for example, platinum, silicide and palladium.

It will be obvious that the invention is not restricted to the examples described but that many variations are possible to those skilled in the art without departing from the scope of this invention.

For example, the conductivity types of the various regions and the polarity of the voltages to be applied to said regions may be reversed.

Instead of a single region 10 adjoining the edge, there may also be several of such regions which are separated from each other, for example, by sunken oxide pattern and which may each comprise individually for draining leakage currents.

The island-insulating electrode pattern may furthermore be formed also by an electrode which is separated from the underlying semiconductor material by an insulating layer, for example an oxide layer, and by means of which electric fields which form an island-insulating electrical barrier can be induced in the surface layer.

I claim:

1. A semiconductor device having a semiconductor body and comprising a surface layer of one conductivity type which adjoins a surface of the body, is provided on a support and is separated from said support by a junction destined for electric insulation, in which at least one component is present in the surface layer in behalf of which the surface layer comprises island-insulating means in the form of an electrode pattern which is present at the surface and which surrounds at least an island-shaped part of the surface layer comprising the component and which is separated from the surface layer by a barrier junction, in which by means of the electrode pattern electric fields can be induced in the surface layer by means of which fields a depletion region is formed below the electrode pattern and extends throughout the thickness of the surface layer, a part of the surface layer which is present at the edge of the surface and outside the pattern and which adjoins the part of the surface layer which can be influenced with the pattern and in which the depletion region can be formed, having an electric connection for draining leakage currents.

2. A semiconductor device as in claim 1, wherein said pattern is present entirely at a distance from the edge of the surface and is separated from the edge by the said part of the surface layer which is present outside the pattern and surrounds the pattern entirely.

3. A semiconductor device as in claim 1 wherein said electrode pattern is formed by a surface zone which is of the second conductivity type opposite to the one conductivity type and is provided in the surface layer, said surface zone extending from the surface into the surface layer over only a part of the thickness of the surface layer.

4. A semiconductor device as in claim 1, wherein said support comprises a semiconductor layer of the second conductivity type forming a p-n junction with the surface layer of the one conductivity type.

5. A semiconductor device as in claim 4, wherein said surface layer comprises along the edge a further insulation region which extends from the surface of the body throughout the thickness of the surface layer down to the substrate.

6. A semiconductor device as in claim 5, wherein said further insulation region is formed by a zone of the second conductivity type which extends from the surface down to the substrate.

7. A semiconductor device as claimed in claim 5, characterized in that the said further insulation region is formed by a zone of insulating material which extends from the surface down to the substrate.

8. A semiconductor device in claim 1, wherein said island-shaped part of the surface layer constitutes the charge transport layer of a charge transfer device, means being present to locally introduce information in the form of electric charge into the island-shaped part, and means to read said charge elsewhere in the island, an electrode system for generating electric fields being present at the surface by means of which fields the charge can be transported to the read-out means through the island in a direction parallel to the surface layer.

9. A semiconductor device as in claim 8, wherein said charge transfer device belongs to the type of charge-coupled devices in which the charge transport can take place at least mainly in the interior of the semiconductor body in behalf of which the island has a thickness and a doping concentration at which a depletion zone can be obtained throughout the thickness of the island by means of an electric field while avoiding breakdown.

10. A semiconductor device as in claim 1, wherein said electrode pattern comprises a Schottky electrode disposed at said surface layer.

* * * * *

UNITED STATES PATENT AND TRADEMARK OFFICE
CERTIFICATE OF CORRECTION

PATENT NO. : 3,965,481
DATED : June 22, 1976
INVENTOR(S) : LEONARD JAN MARIA ESSER It is certified that error appears in the above-identified patent and that said Letters Patent are hereby corrected as shown below:

Column 9, line 2, after "individually" insert --a connection--

Signed and Sealed this

Thirtieth Day of November 1976

[SEAL]

Attest:

RUTH C. MASON
*Attesting Officer*

C. MARSHALL DANN
*Commissioner of Patents and Trademarks*